(12) United States Patent
Takubo

(10) Patent No.: US 7,425,757 B2
(45) Date of Patent: Sep. 16, 2008

(54) SEMICONDUCTOR POWER MODULE

(75) Inventor: Hiromu Takubo, Tokyo (JP)

(73) Assignee: Fuji Electric Device Technology Co., Ltd. (JP)

( * ) Notice: Subject to any disclaimer, the term of this patent is extended or adjusted under 35 U.S.C. 154(b) by 56 days.

(21) Appl. No.: 11/017,187

(22) Filed: Dec. 20, 2004

(65) Prior Publication Data

US 2005/0156251 A1    Jul. 21, 2005

(30) Foreign Application Priority Data

Dec. 22, 2003    (JP) ............................. 2003-424421

(51) Int. Cl.
H01L 23/02    (2006.01)

(52) U.S. Cl. .................... 257/678; 257/693; 257/690

(58) Field of Classification Search ................ 257/690, 257/691, 692, 693, 666, 672, 676, 684, 678, 257/731, 734; 361/734, 764, 773, 782–783, 361/803, 814, 816, 818, 813
See application file for complete search history.

(56) References Cited

U.S. PATENT DOCUMENTS

| | | | | |
|---|---|---|---|---|
| 5,220,298 | A | * | 6/1993 | Nagase ........................ 333/185 |
| 5,444,297 | A | | 8/1995 | Oshima et al. |
| 5,825,042 | A | | 10/1998 | Strobel et al. |
| 5,864,088 | A | | 1/1999 | Sato et al. |
| 6,147,368 | A | * | 11/2000 | Kon et al. .................... 257/146 |
| 6,262,362 | B1 | | 7/2001 | Czjakowski et al. |
| 6,410,981 | B2 | | 6/2002 | Tao |
| 6,695,985 | B2 | * | 2/2004 | Igarashi et al. ............ 252/518.1 |
| 2002/0167017 | A1 | * | 11/2002 | Nakabayashi et al. ......... 257/98 |
| 2004/0125529 | A1 | | 7/2004 | Arai et al. |
| 2005/0135065 | A1 | * | 6/2005 | Nakatsu et al. ............. 361/703 |
| 2006/0284211 | A1 | | 12/2006 | Takubo |

FOREIGN PATENT DOCUMENTS

| | | |
|---|---|---|
| JP | 9-121016 A | 5/1997 |
| JP | 11-127583 A | 5/1999 |
| JP | 11-238844 A | 8/1999 |
| JP | 2000-58740 A | 2/2000 |
| JP | 2001-160605 A | 6/2001 |
| JP | 2001-185679 A | 7/2001 |
| JP | 2003-017610 A | 1/2003 |
| JP | 2004-207432 A | 7/2004 |

* cited by examiner

*Primary Examiner*—Thao X. Le
*Assistant Examiner*—Thanh Y Tran
(74) *Attorney, Agent, or Firm*—Rossi, Kimms & McDowell LLP

(57) ABSTRACT

A semiconductor power module includes a filter element made of a magnetic material that can be exchanged as required, while providing a package having a compact size. The power module can be used for a power conversion device for providing power conversion of DC power or AC power by switching a power semiconductor element, such as an IGBT. The filter element can be an annular magnetic member that rests around one or more terminals connected to the power semiconductor element. Noise current flowing through the terminals, when the power semiconductor element is switched, can be suppressed effectively with the annular magnetic member.

16 Claims, 10 Drawing Sheets

FIG. 3(e)
FIG. 3(f)
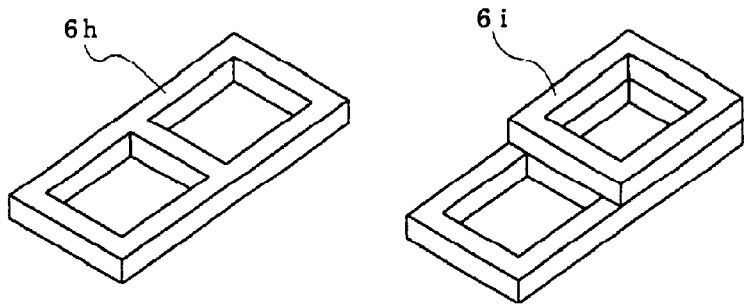
FIG. 4
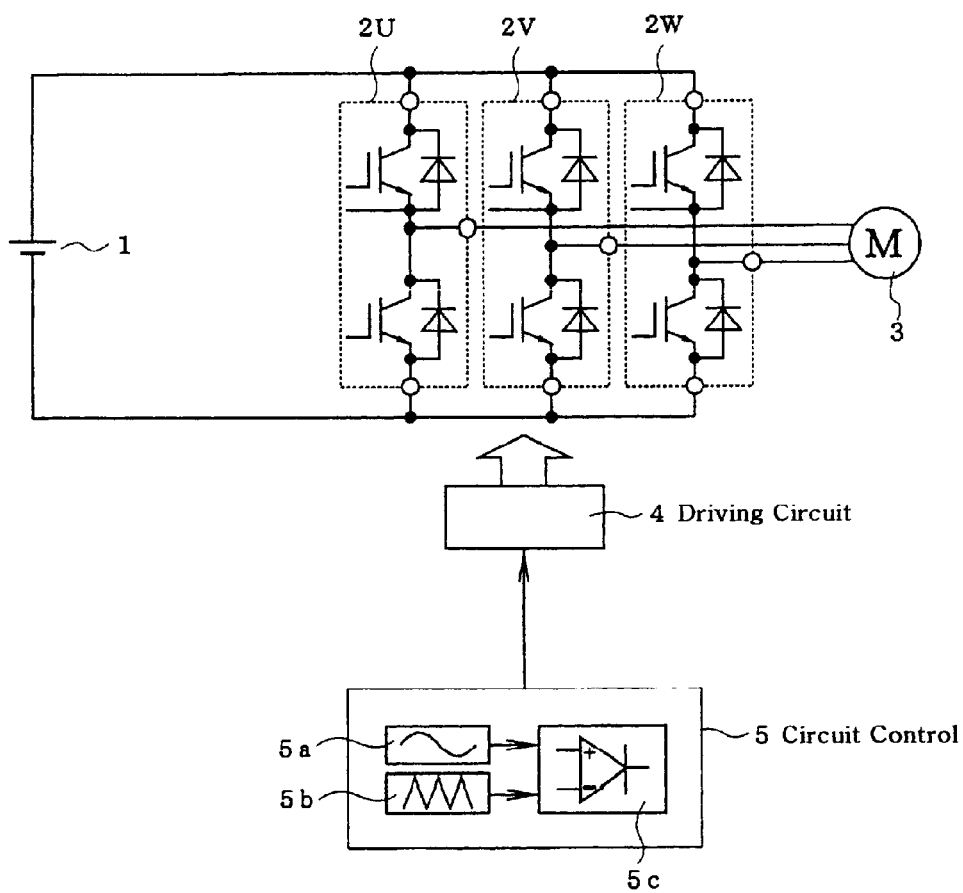

SEMICONDUCTOR POWER MODULE

BACKGROUND

Power conversion devices, such as a device for driving an alternate current motor (so-called inverter) and an Uninterruptible Power Supply (UPS), convert power by switching a power semiconductor element. FIG. 4 shows an exemplary circuit diagram of such a power conversion device. Such a device has a direct current (DC) power source 1, semiconductor power modules 2U, 2V, 2W, each formed of two serially connected Insulated Gate Bi-polar Transistors (IGBT) (acting a power semiconductor element) connected to two Free Wheel Diodes pairs in an antiparallel manner, and a load 3, such as a motor. The semiconductor power modules 2U, 2V, and 2W are connected in parallel, and the upper and lower arms of the IGBT for each phase are alternately switched to convert the direct current of the DC power source 1 to the alternate current, thereby supplying the converted power to the motor 3. The gate driving circuit of the IGBT is not illustrated in FIG. 4.

In a well-known Pulse Width Modulation control method (PWM) for switching an IGBT, a comparison calculation section 5c of an external control circuit 5 compares the magnitudes of a reference sinusoidal wave 5a and an output voltage order 5b to determine a width of a switching pulse. This switching pulse is sent to a driving circuit 4 for conversion to a gate signal to the IGBT, and is output to the power modules 2U, 2V, and 2W, respectively.

The power semiconductor element, including the IGBTs and Free Wheel Diodes, is mounted in a single package to constitute the semiconductor power modules 2U, 2V, and 2W, thereby providing a device of a simple structure. This simplifies the assembly operation and wiring operation, and further allows the elements to be cooled easily.

Recently, another type of power module has been developed. Here, the power semiconductor elements and the driving circuit 4 for driving IGBT are collectively mounted in a single package or container. This kind of module is called an Intelligent Power Module (IPM), the design of which centers on a simplification of the structure of an electric power conversion device. FIG. 5 illustrates such a power conversion device comprising the IPM 2A, which further includes an IGBT, Free Wheel Diodes, a diode, a driving circuit 4 or the like, DC input terminals 2a and 2b connected to a DC power source 1, alternate current (AC) output terminals 2c, 2d, and 2e connected to a load 3, a connection terminal 2f for a braking resistor 11, and a control input terminal 2g connected to a control circuit 5.

In the power conversion device, including the above-described conventional semiconductor power modules 2U, 2V, and 2W and/or IPM 2A, switching of the power semiconductor element causes an excessive switching noise, which can increase the risk of a failure, such as a malfunction of separate devices located around the power conversion device, or undesirable noise to be contained within circuits of such separate devices. The switching noise can be classified into two main types.

The first is a normal mode noise caused by a normal mode high frequency current flowing in a closed loop consisting of a power module and a DC power source. FIG. 6A shows a closed loop 10N in which a normal mode noise current flows. In FIG. 6A, reference numeral 2 denotes a power module representing one phase power module in the above-described semiconductor power modules 2U, 2V, and 2W and the IPM 2A. This normal mode is a mode in which a high-frequency noise current, caused by LC resonance, flows in the closed loop 10N. Specifically, this LC resonance is created, during switching of the power semiconductor element, due to the floating inductance of the wiring constituting the closed loop 10N, and the junction capacitance of the power semiconductor element.

The second switching noise is a common mode noise caused by a noise current flowing the grounding through the floating capacitance in the power module and the power conversion device. FIG. 7A shows the closed loop 10C through which this common mode noise current flows. This common mode is a mode in which a significant voltage change due to the switching of the power semiconductor element (dV/dt) causes the floating capacitances 7 and 8 to be charged and discharged at a high frequency. The charged and discharged currents flow in the closed loop 10C via the grounding. In this mode, the noise current can flow out to the DC power source 1 or emitted as an electric wave.

To suppress the above-described normal mode noise current or common mode noise current, a conventional practiced is to add impedance, such as an inductance, to the loop of a noise current. FIG. 6B shows a conventional technique for suppressing the normal mode noise current by serially connecting the power module 2 to an inductor 6a. FIG. 7B shows a conventional technique for suppressing the common mode noise current by connecting a positive pole and a negative pole of the DC input terminal of the power module 2 to both ends of the DC power source 1 via an inductor 6b. This technique suppresses noise current because the inductor 6b functions as an impedance component to the noise current flowing to the grounding side via the floating capacitances 7 and 8 in FIG. 7A.

In the techniques illustrated in FIG. 6B and FIG. 7B, the normal mode noise current and the common mode noise current can be suppressed to a limited level. In this case, providing the inductor for suppressing the noise current at a position closer to the semiconductor element is effective in downsizing the entire circuit, and in packaging of the entire circuit. In this regard, the techniques described in the following patent publications have been contemplated.

Japanese Laid-Open Publication No. 2000-58740 discloses means for suppressing the common mode noise current. Specifically, the periphery of the positive and negative poles of the inner lead (connection line) for supplying a DC power source of a semiconductor device (IC chip) connected to the DC power source are surrounded by an annular composite magnetic material, which is used as a filter element, thereby filling this material into the package. On the other hand, Japanese Laid-Open Publication No. 9-121016 discloses a noise reduction element made of an amorphous magnetic alloy that is externally fitted with a lead section of various semiconductor elements (e.g., diode) or that is integrally molded.

In the conventional technique described in the former patent publication, the composite magnetic material cannot be changed with a different one (i.e. change the inductance value) because the composite magnetic material used as a filter element is sealed in the package. The frequency of switching noise differs depending on the conditions of an external circuit (e.g., floating inductance of a wiring, floating capacitance). The present inventors have found that it is highly desirable to attach the filter element to the exterior of the package so that the filter element can be changed as required. Such an exchange operation is impossible according to the technique disclosed in the former patent publication. Another problem is that the composite magnetic material sealed in the package enlarges the package. Furthermore, the conventional technique described in the latter patent publication cannot be directly used for a power module having a medium to large capacity since this technique is for a semiconductor element with a lead wiring having a relatively small capacity. It is also impossible to externally fit the noise reduction element as described in the latter patent publication to the terminal of the power module because the terminal is generally connected to a large-sized wiring component (e.g., copper bar having a large area) for larger currents.

Accordingly, there is a need for a semiconductor power module that allows a magnetic member used as a filter element to be easily changeable. Also, there is a need for a semiconductor power module having a smaller package. Moreover, there is a need for a semiconductor power module that can be used regardless of the capacity of each power semiconductor element or the entirety of the module and regardless of the type of Intelligent Power Module, including therein semiconductor power elements for one phase of upper and lower arms and a driving circuit. The present invention addresses these needs.

SUMMARY OF THE INVENTION

The present invention relates to a semiconductor power module that can suppress switching noise caused by switching of a power semiconductor element. The present semiconductor power module can have any function and structure, as long as it includes therein a power semiconductor element, and a terminal connected to the power semiconductor element at the exterior of the module package.

The semiconductor power module can include a module package, at least one power semiconductor element contained in the module package and at least one terminal connected to the power semiconductor element and provided at the exterior of the module package, and an annular magnetic member for reducing noise current flowing through the terminal positioned to surround the terminal. It further includes a driving circuit for the power semiconductor element contained in the module package.

The module package can include a recessed portion formed around the terminal to provide a space for resting the magnetic member. The area around the terminal can also project beyond the main surface of the module package to provide a space for resting magnetic member.

The terminal can be for transmitting AC or DC power (e.g., AC or DC input terminal) or transmitting a control signal (e.g., control input terminal) to the power semiconductor element.

BRIEF DESCRIPTION OF THE DRAWINGS

FIG. 3E is a perspective view of another embodiment of the annular magnetic member.

FIG. 3F is a perspective view of yet another embodiment of the annular magnetic member.

FIG. 4 is a circuit diagram of a power conversion device having a semiconductor power module according to the prior art.

DETAILED DESCRIPTION

Figure 1A:
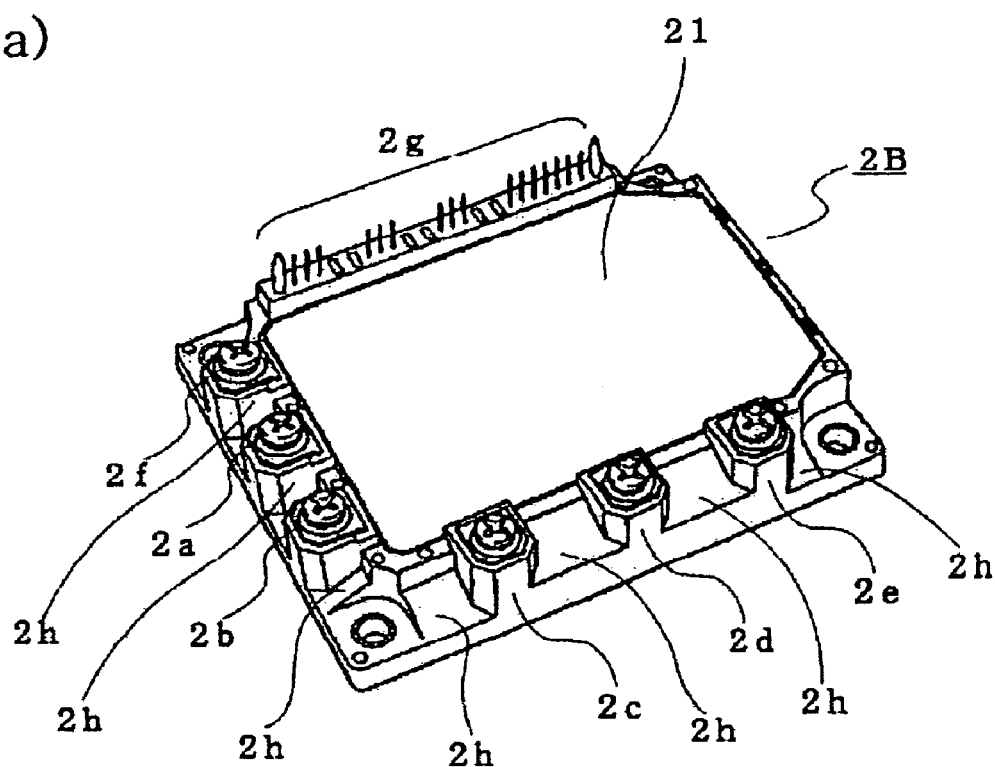
FIG. 1A is a perspective view illustrating an embodiment of an IPM, according to the present invention.
Figure 1B:
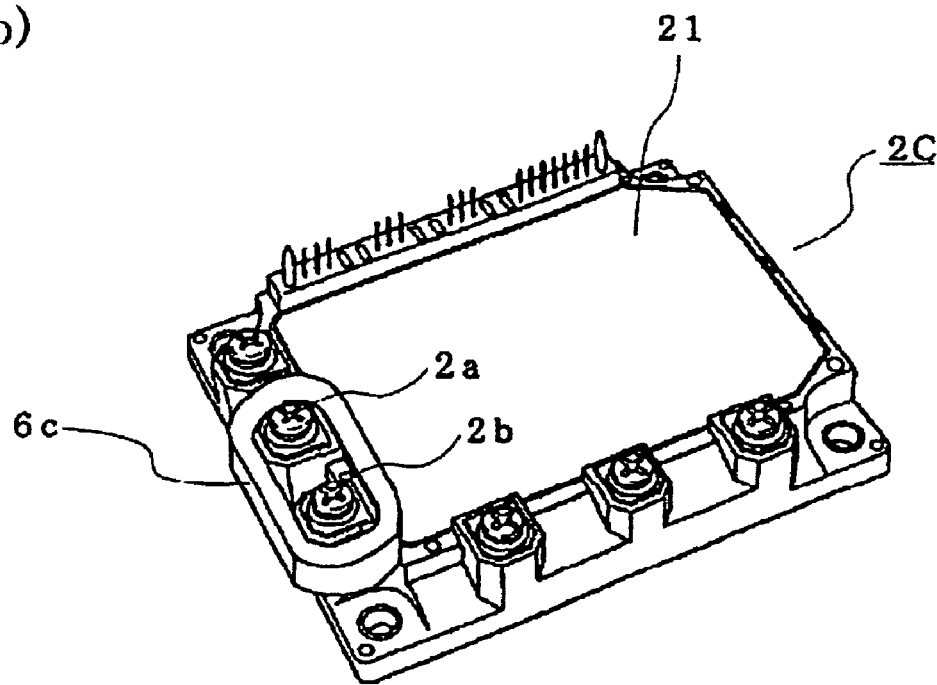
FIG. 1B illustrates the embodiment of FIG. 1A with an annular magnetic member positioned around a plurality of terminals.
Figure 1C:
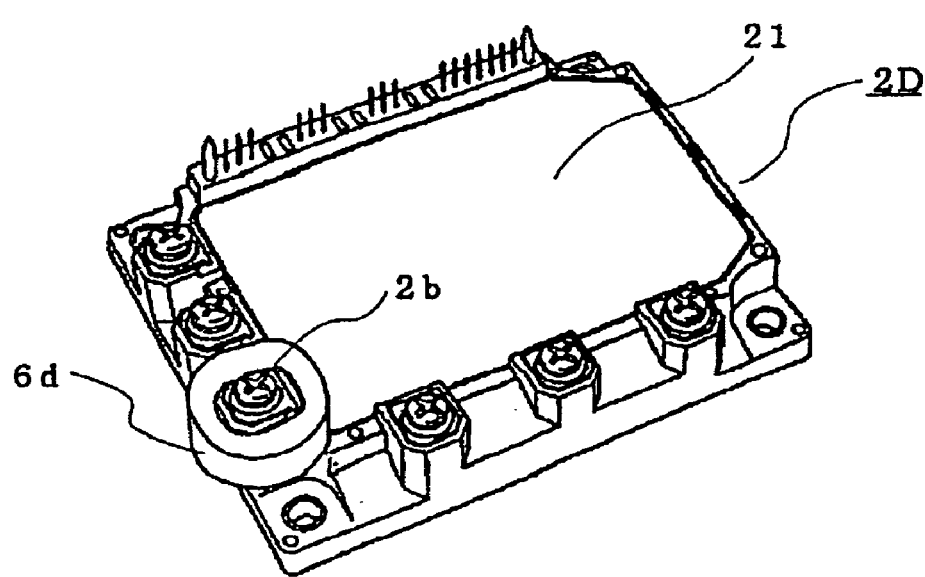
FIG. 1C illustrates the embodiment of FIG. 1A with an annular magnetic member positioned around a single terminal.
Figure 5:
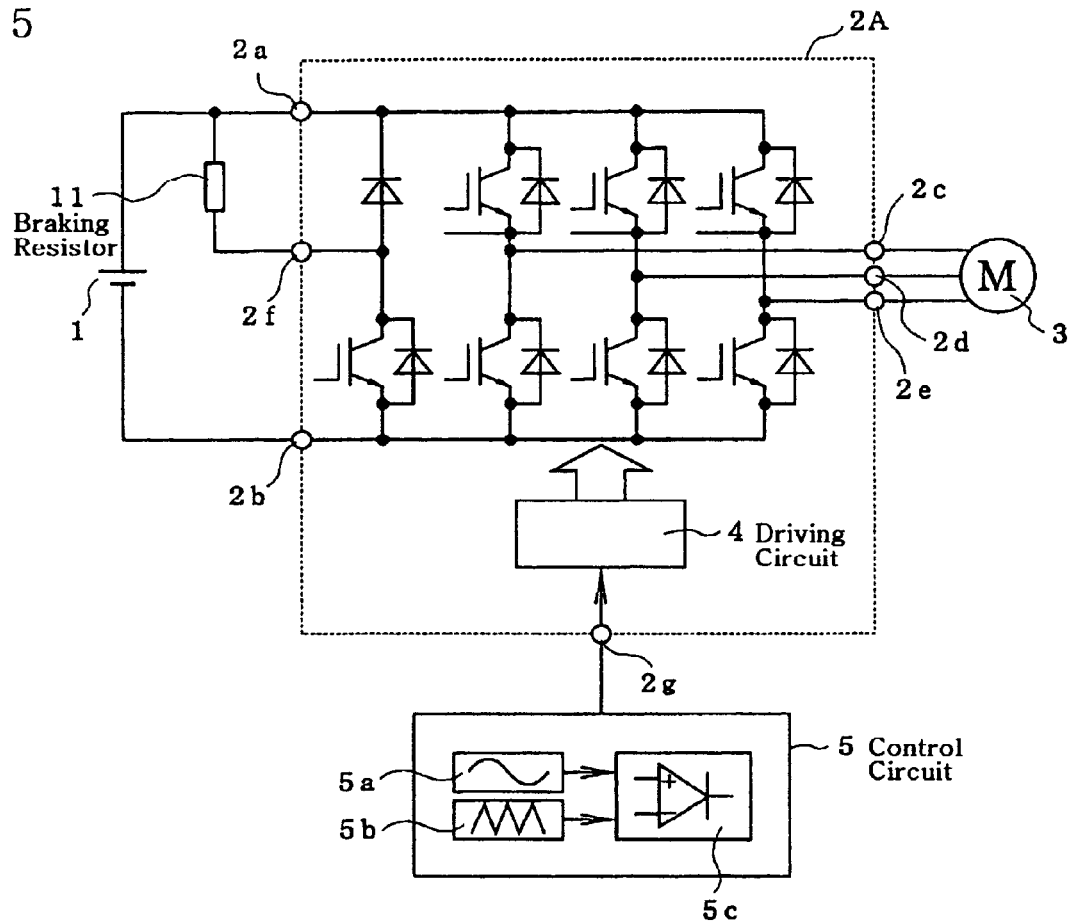
FIG. 5 is a circuit diagram of a power conversion device having an Intelligent Power Module according to the prior art.
Figure 6A:
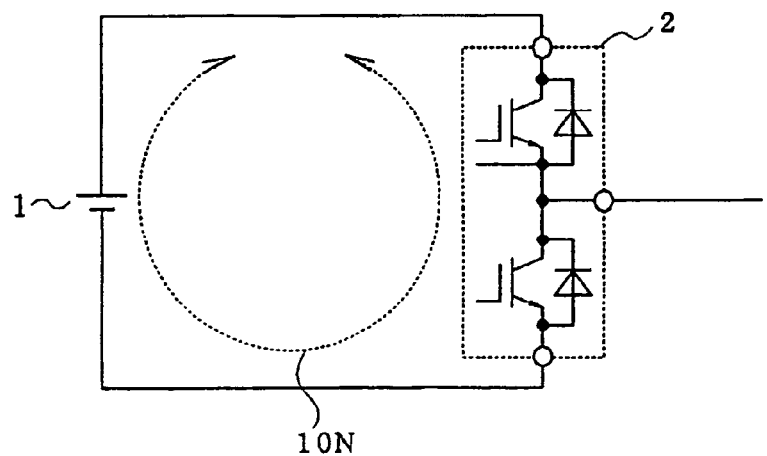
FIG. 6A is a circuit diagram for explaining a loop of normal mode noise current according to the prior art.
Figure 6B:
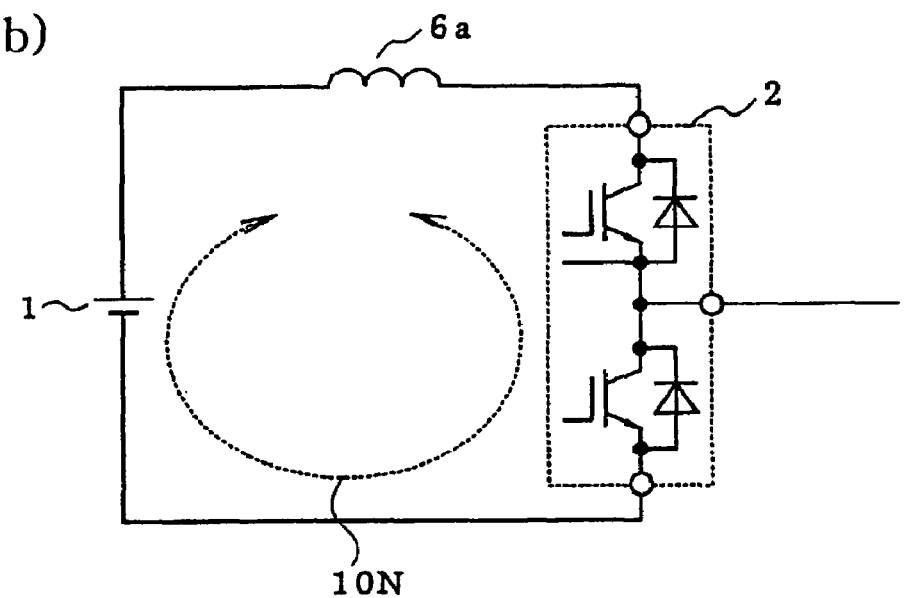
FIG. 6B is a conventional circuit diagram for suppressing normal mode noise current according to the prior art.
Figure 7A:
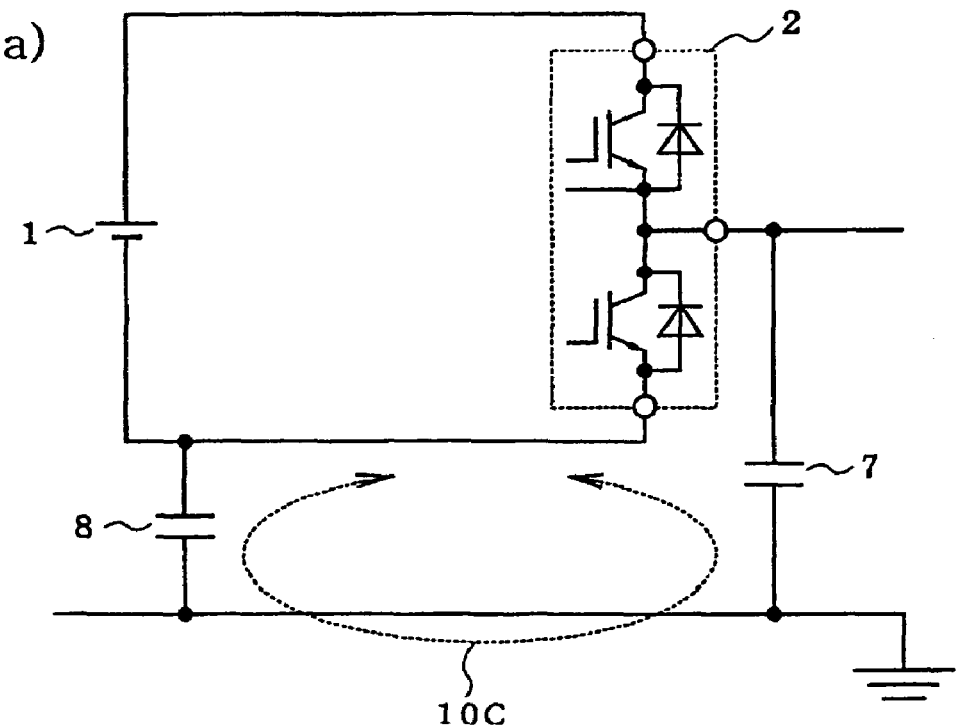
FIG. 7A is a circuit diagram for explaining a loop of common mode noise current according to the prior art.
Figure 7B:
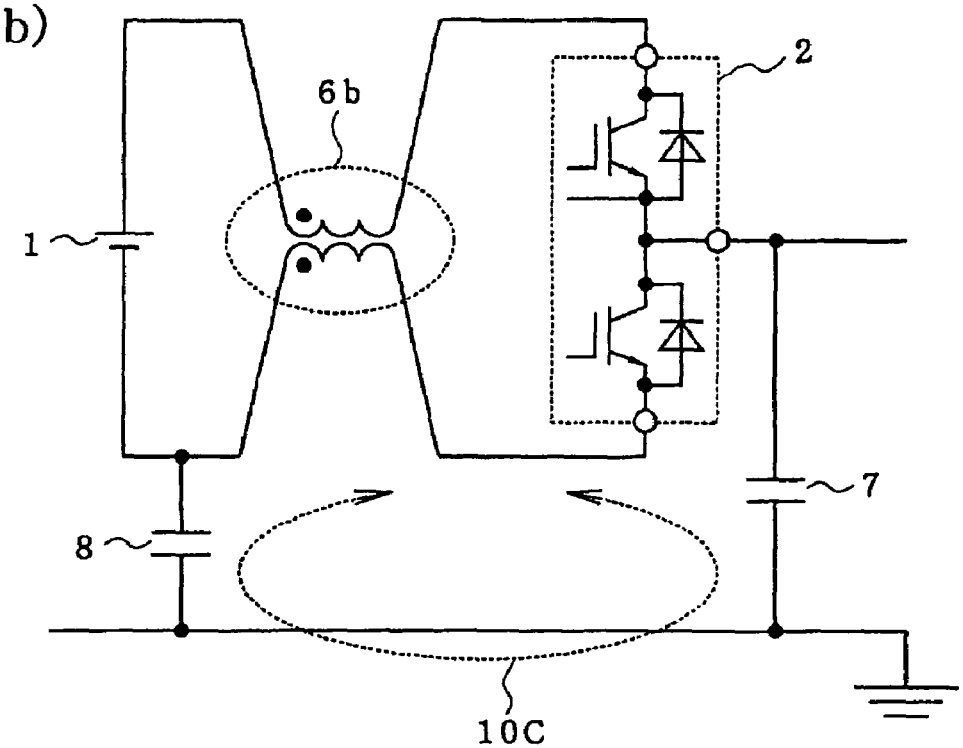
FIG. 7B is a conventional circuit diagram for suppressing common mode noise current according to the prior art.

FIGS. 1A-1C illustrate an embodiment of an IPM 2B, which includes a module package 21 (made of resin for example), within which includes the IGBT, a Free Wheel Diode, a diode, a driving circuit, and semiconductor power modules, as illustrated in the Intelligent Power Module 2A of FIG. 5. In the present embodiment, the module package 21, however, has at its periphery DC input terminals 2a and 2b connected to internal circuit components, AC output terminals 2c, 2d, and 2e, the connection terminal 2f of a braking resistor 11, and a control input terminal 2g. The circuit components (e.g., IGBT) are connected to the terminals 2a to 2g, as in the case of the IPM 2A of FIG. 5. As illustrated, in the present embodiment, the area around the terminals 2a to 2g can project beyond, at a position slightly higher than, the main surface of the module package 21. A recessed portion 2h is also provided around the terminals. Such a configuration provides a dedicated space for positioning, resting, or seating an annular magnetic member 6c, 6d, 6e.

FIG. 1B illustrates an IPM 2C, which is the IPM of FIG. 1A with the annular magnetic member 6c fitted to collectively surround the DC input terminals 2a and 2b. In this example, the annular magnetic member 6c operates as an inductor for removing the common mode noise.

FIG. 1C illustrates an IPM 2D, which is the IPM 2B of FIG. 1A with the annular magnetic member 6d fitted to surround the DC input terminal 2b at the negative pole side. In this example, the annular magnetic member 6d operates as an inductor for removing the normal mode noise. The annular magnetic member 6d also can be fitted to surround the DC input terminal 2a at the positive pole side or another terminal. The annular magnetic members 6c and 6d can be a ferrite-sintered body molded to have an annular shape or similar configuration.

Figure 1D:
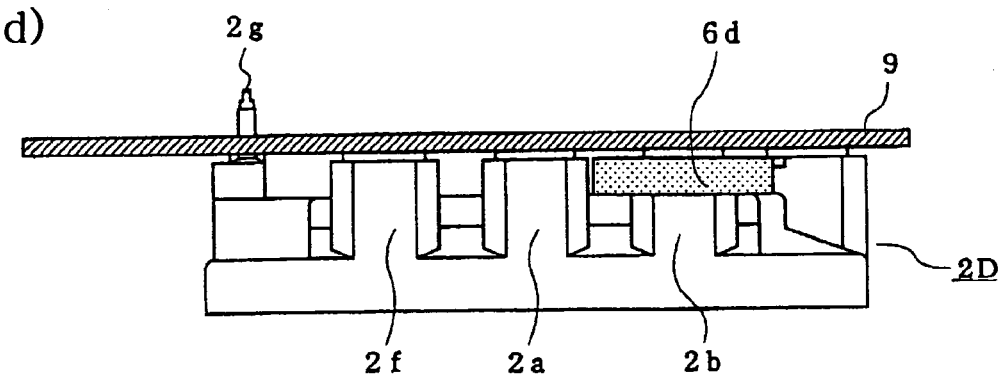
FIG. 1D is a side view of FIG. 1C.

FIG. 1D illustrates a lateral side view of the IPM 2D of FIG. 1C (taken along the terminals 2f, 2a, and 2b). The annular magnetic member 6d is fitted between a copper bus bar 9 for connecting, via wiring, the terminals 2a, 2b, and 2f and the IPM 2D.

As shown in FIG. 1A to FIG. 1D, the magnetic members 6c or 6d can be fitted to surround the terminals 2a to 2g provided at the exterior of the module package 21, thereby providing a measure for reducing noise without increasing the size of the module package 21. By providing the annular magnetic member at the exterior of the module package 21, it can be readily changed with another one having a desired inductance suitable for the noise frequency. Thus, the magnetic member is exchangeable.

To provide the annular magnetic member with such a desired inductance value, the inductance value can be changed by changing the material of the annular magnetic member (magnetic permeability ratio) without changing the outer shape or by changing the number of other thin annular magnetic members.

Figure 2A:
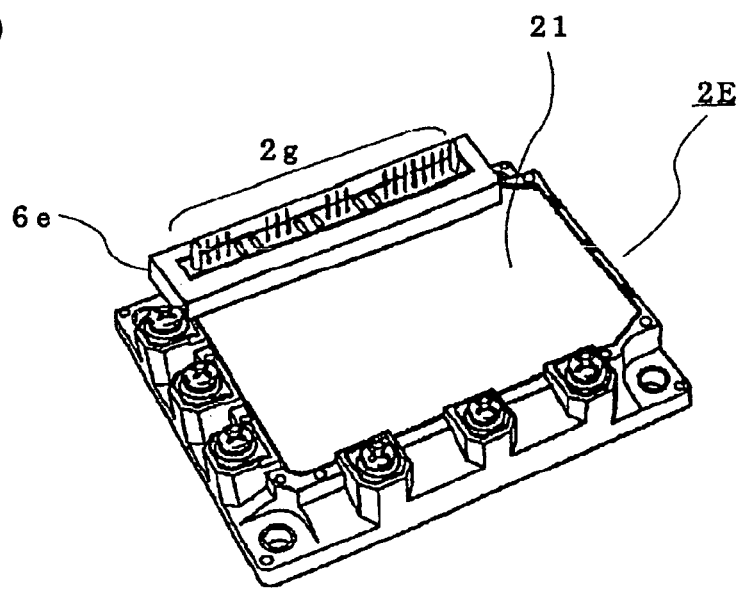
FIG. 2A illustrates the embodiment of FIG. 1A with an annular ring member positioned around control input terminals.

FIG. 2A illustrates an IPM 2E, which is the IPM 2B of FIG. 1A with a rectangular shaped annular magnetic member 6e fitted to surround the control input terminal 2g. In this case, the area around the control input terminal 2g is raised slightly to project beyond the surface of the module package 21 as shown in FIG. 2A, thereby providing a space around the control input terminal 2g for resting or seating the magnetic member. If the control input terminal 2g and the surface of the module package 21 are provided at the same height, the area around the control input terminal 2g can be recessed to provide a space for seating the magnetic member.

Figure 2B:
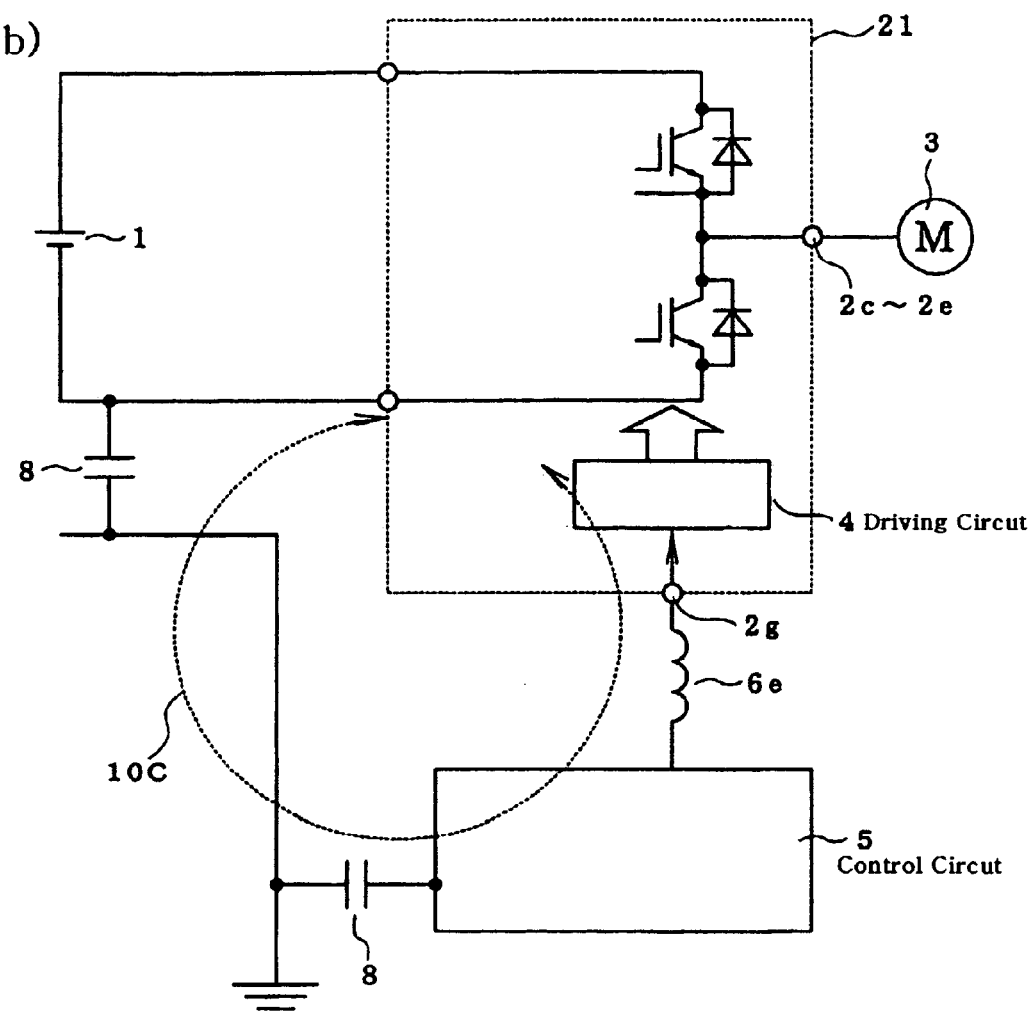
FIG. 2B is a circuit diagram illustrating a path in which the noise current in the embodiment of FIG. 2A flows.

FIG. 2B shows a path in which the common mode noise current flows in FIG. 2A. FIG. 2B shows only a power semiconductor element for one phase of upper and lower arms with regards to the circuit configuration in the module package 21. Some common mode noise current can go through the control input terminal 2g of the IPM 2E to flow through floating capacitance 8 between the power module and the grounding or between the control circuit 5 and the grounding. Such noise current can be suppressed by inserting the annular magnetic member 6e within the noise current path 10C. When the annular magnetic member 6e is fitted in a recessed portion surrounding the control input terminal 2g, the annular magnetic member 6e does not interfere with a wiring operation using the copper bus bar 9 shown in FIG. 1D or a wiring operation using a print substrate.

Figure 3A:
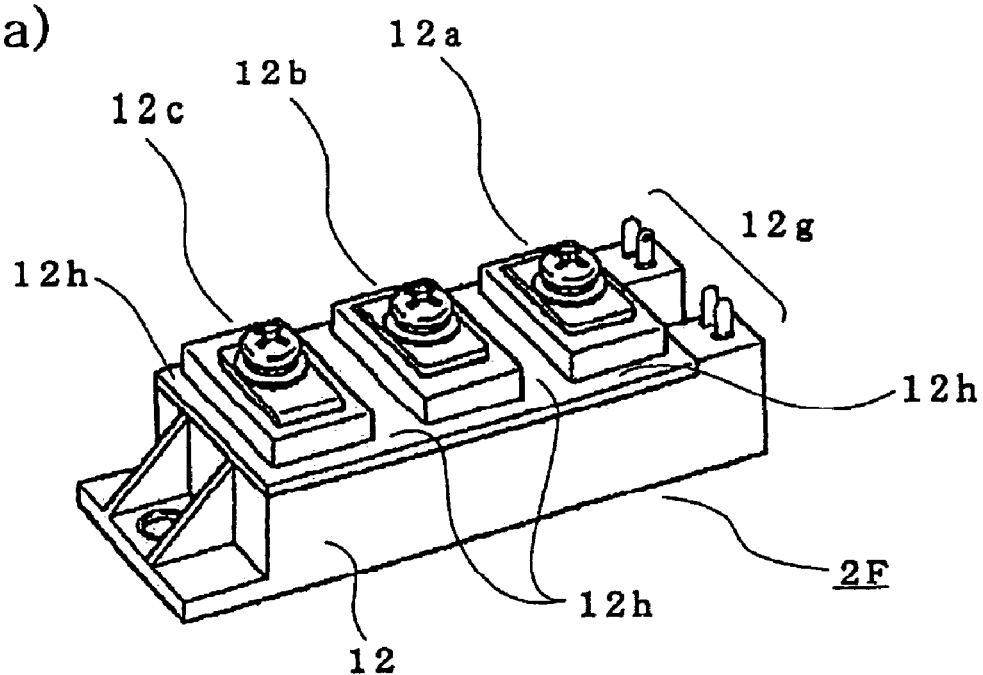
FIG. 3A is a perspective view illustrating an embodiment of a semiconductor power module according to the present invention.

FIG. 3A illustrates another embodiment of the semiconductor power module including therein a power semiconductor element for one phase of upper and lower arms. These power modules correspond to the above-described semiconductor power modules 2U, 2V, and 2W shown in FIG. 4, for example. A semiconductor power module 2F shown in FIG. 3A has a positive pole-side DC input terminal 12a, a negative pole-side DC input terminal 12b, an AC output terminal 12c, and a control input terminal 12g, all of which can be arranged as desired. This embodiment also secures a dedicated space for seating the annular magnetic member 6f, 6g around the terminals 12a, 12b, 12c, and 12g. For instance, the dedicated seat can be formed by projecting the area around the terminals beyond the main surface of the module package 12 and/or forming a recessed portion 12h around the terminals 12a, 12b, 12c, and 12g.

Figure 3B:
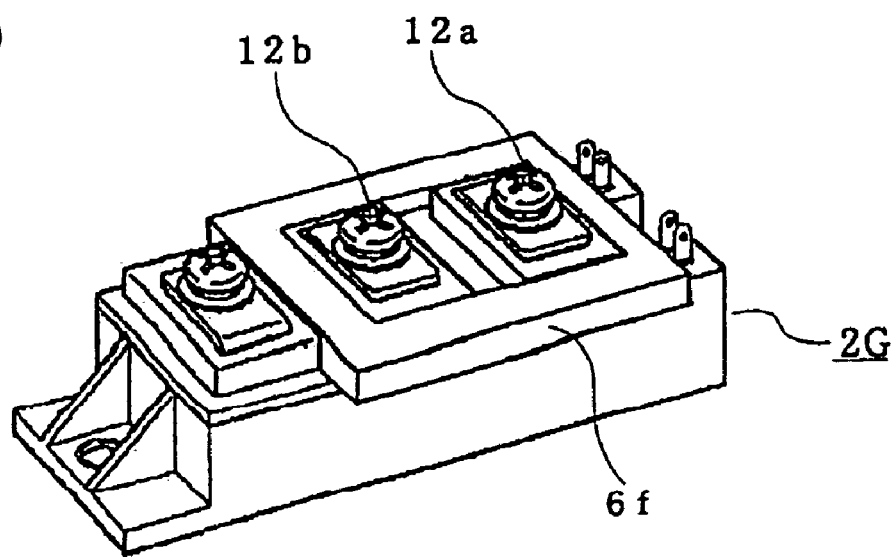
FIG. 3B illustrates the embodiment of FIG. 3A with an annular magnetic member positioned around a plurality of terminals.

FIG. 3B illustrates a semiconductor power module 2G, which is the power module 2F with the annular magnetic member 6f collectively fitted around the DC input terminals 12a and 12b. The semiconductor power module 2G has a structure for using the annular magnetic portion 6f to suppress the common mode noise.

Figure 3C:
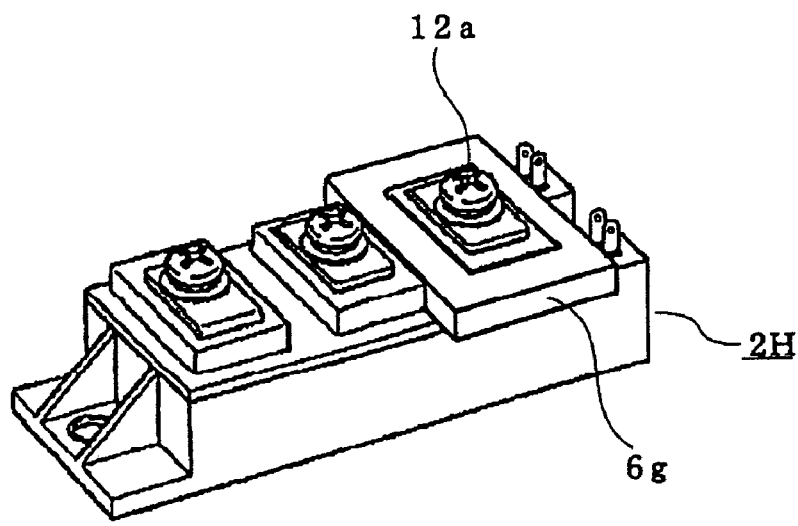
FIG. 3C illustrates the embodiment of FIG. 3A with an annular magnetic member positioned around a single terminal.

FIG. 3C illustrates a semiconductor power module 2H, which is the power module 2F with the annular magnetic member 6g fitted around only the positive pole-side DC input terminal 12a. The semiconductor power module 2H has a structure for using the annular magnetic portion 6g to suppress the normal mode noise. The annular magnetic portion 6g can also be fitted to the negative pole-side DC input terminal 12b.

Since the annular magnetic portions 6f and 6g can be fitted while each terminal has an open space at the upper side thereof, there is no risk of the annular magnetic portions 6f and 6g interfering with a copper bus bar or the like during wiring. Furthermore, the annular magnetic portions 6f and 6g easily can be insulated to prevent from short-circuiting with each other, such as by covering the surface of the annular magnetic portions 6f and 6g with an insulative resin, for example.

Figure 3D:
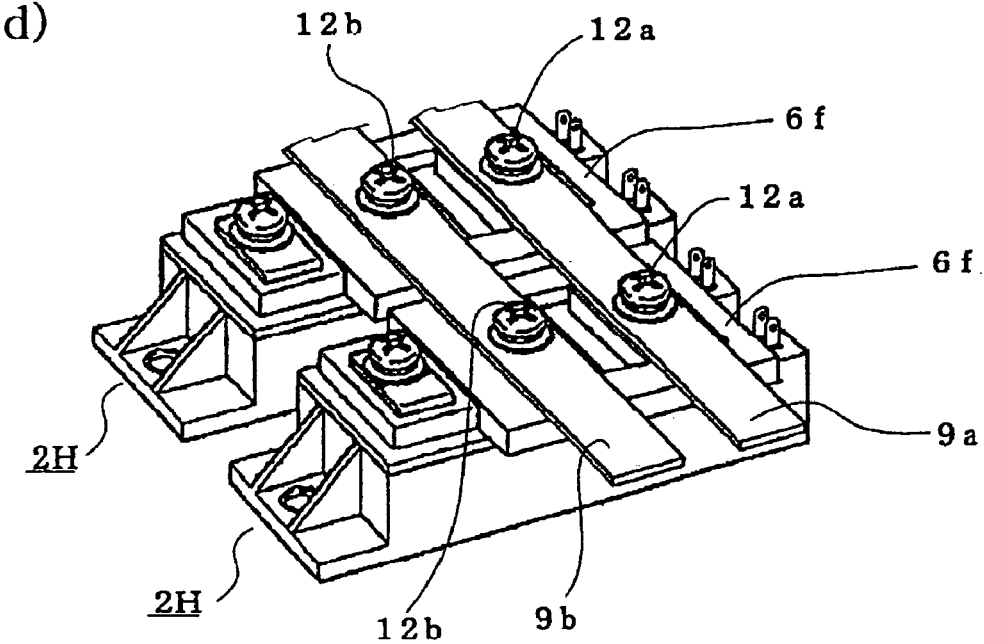
FIG. 3D illustrates a plurality of power modules of FIG. 3B connected to conductor bars.

FIG. 3D shows an example in which the positive pole-side DC input terminals 12a and the negative pole-side DC input terminals 12b of the plurality of semiconductor power modules 2H are connected by copper bus bars 9a and 9b, respectively. The copper bus bars 9a and 9b can be connected to the respective terminals while being placed on the upper faces of the annular magnetic portion 6f. Thus, conventional members can be used without changing the shape or structure of the copper bus bars 9a and 9b.

As described above, the embodiments of FIG. 3A to FIG. 3D have a similar structure in which the annular magnetic portions 6f and 6g are fitted to surround each terminal. Thus, this structure can be made smaller as compared to a module package that includes an internal filter element. It is also possible to exchange, as described above, the existing annular magnetic member with a different one having a desired inductance suitable for the noise frequency.

Furthermore, to reduce the normal mode noise and the common mode noise at the same time, the structures shown in FIG. 3B and FIG. 3C can be combined or substantially "θ" or figure 8-shaped annular magnetic members 6h and 6i as shown in FIGS. 3E and 3F.

When the noise current paths in the above embodiments include an AC output terminal, an annular magnetic body can be fitted to surround the AC output terminal. Alternatively, the annular magnetic body also can be fitted to the DC output terminal or the AC input terminal in accordance with the function of the power conversion device (e.g., DC-DC conversion, AC-DC conversion), thereby providing a measure for reducing noise.

Although the above embodiments shows circular or square-shaped integrally-molded annular magnetic bodies used as an annular magnetic body, the same effect also can be obtained by an annular magnetic body obtained by combining "C"-shaped and "I"-shaped magnetic bodies. Here, the term "annular" includes all shape having a closed loop configuration, not just a circular shape.

The above embodiments also show a structure in which all terminals of the power module are surrounded by a space in which the magnetic member is provided. However, it is sufficient to provide a space in which the magnetic member is provided to only surround such a terminal that has therein the flow of noise current and that needs to suppress the noise current.

Furthermore, as described above, any of a structure in which a terminal is surrounded by a recessed portion and a structure in which a terminal itself is provided in a projecting manner is also included in the scope of the present invention because the present invention is characterized in that a terminal provided at the exterior of a module package is surrounded by a space in which a magnetic member is provided.

By attaching the annular magnetic member to a terminal provided at the exterior of the module package, common mode noise current or normal mode noise current due to the annular magnetic member can be suppressed without causing the package to have a larger size. When the conditions of the external circuit are changed, the annular magnetic member also can be exchanged with another one having an optimal inductance because the inductance required for a filter element changes in accordance with the frequency of the switching noise, which depends on the conditions of the external circuit. The annular magnetic member can be exchanged easily because it is externally fitted to the terminal.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosure of the priority applications, JP 2003-424421, in its entirety, including the drawings, claims, and the specification thereof, is incorporated herein by reference.

What is claimed is:

1. A semiconductor power module comprising:
   a module package;
   at least one power semiconductor element contained in the module package and at least one terminal connected to the power semiconductor element and provided at the exterior of the module package; and
   a replaceable filter member made of magnetic material for reducing noise current flowing through the terminal and positioned to surround the terminal,
   wherein the replaceable filter member is exposed so as to be replaceable from the module package and is substantially annular in shape to surround the terminal.

2. A semiconductor power module according to claim 1, further including a driving circuit for the power semiconductor element contained in the module package.

3. A semiconductor power module comprising:
   a module package;
   at least one power semiconductor element contained in the module package and at least one terminal connected to the power semiconductor element and provided at the exterior of the module package; and
   a replaceable filter member made of magnetic material for reducing noise current flowing through the terminal and positioned to surround the terminal,
   wherein the replaceable filter member is exposed so as to be replaceable from the module package, and
   wherein the module package includes a recessed portion formed around the terminal to provide a space for resting the replaceable filter member.

4. A semiconductor power module according to claim 2, wherein the module package includes a recessed portion formed around the terminal to provide a space for resting the replaceable filter member.

5. A semiconductor power module comprising:
   a module package;
   at least one power semiconductor element contained in the module package and at least one terminal connected to the power semiconductor element and provided at the exterior of the module package; and
   a replaceable filter member made of magnetic material for reducing noise current flowing through the terminal and positioned to surround the terminal,
   wherein the replaceable filter member is exposed so as to be replaceable from the module package, and
   wherein an area around the terminal projects beyond a main surface of the module package to provide a space for resting the replaceable filter member.

6. A semiconductor power module according to claim 2, wherein an area around the terminal projects beyond a main surface of the module package to provide a space for resting the replaceable filter member.

7. A semiconductor power module according to claim 1, wherein the terminal is for transmitting AC or DC power or transmitting a control signal to the power semiconductor element.

8. A semiconductor power module according to claim 2, wherein the terminal is for transmitting AC or DC power or transmitting a control signal to the power semiconductor element.

9. A semiconductor power module according to claim 3, wherein the terminal is for transmitting AC or DC power or transmitting a control signal to the power semiconductor element.

10. A semiconductor power module according to claim 4, wherein the terminal is for transmitting AC or DC power or transmitting a control signal to the power semiconductor element.

11. A semiconductor power module according to claim 5, wherein the terminal is for transmitting AC or DC power or transmitting a control signal to the power semiconductor element.

12. A semiconductor power module according to claim 6, wherein the terminal is for transmitting AC or DC power or transmitting a control signal to the power semiconductor element.

13. A semiconductor power module according to claim 1, wherein the replaceable filter member surrounds one terminal.

14. A semiconductor power module according to claim 1, wherein a plurality of terminals connect to the at least one power semiconductor element contained in the module package and the terminals are provided at the exterior of the module package.

15. A semiconductor power module according to claim 14, wherein the replaceable filter member surrounds at least two of the terminals.

16. A semiconductor power module comprising:
    a module package;
    at least one power semiconductor element contained in the module package and at least one terminal connected to the power semiconductor element and provided at the exterior of the module package; and
    a replaceable filter member made of magnetic material for reducing noise current flowing through the terminal and positioned to surround the terminal,
    wherein the replaceable filter member is exposed so as to be replaceable from the module package, and
    wherein a plurality of terminals connect to the at least one power semiconductor element contained in the module package and provided at the exterior of the module package,
    wherein the replaceable filter member is figure-8 shaped to surround at least two terminals.

* * * * *